United States Patent
Cok et al.

(10) Patent No.: US 7,548,021 B2
(45) Date of Patent: Jun. 16, 2009

(54) OLED DEVICE HAVING IMPROVED LIGHT OUTPUT

(75) Inventors: Ronald S. Cok, Rochester, NY (US); Joseph F. Revelli, Jr., Rochester, NY (US); Donald R. Preuss, Rochester, NY (US); Joel D. Shore, Rochester, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 462 days.

(21) Appl. No.: 11/232,559

(22) Filed: Sep. 22, 2005

(65) Prior Publication Data

US 2007/0063628 A1    Mar. 22, 2007

(51) Int. Cl.
*H01J 1/62* (2006.01)
*H01J 63/04* (2006.01)

(52) U.S. Cl. .................. 313/506; 313/498; 313/504; 313/512

(58) Field of Classification Search ......... 313/498–512, 313/110–113
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 6,670,772 B1 | 12/2003 | Arnold et al. | |
| 6,737,800 B1 | 5/2004 | Winters et al. | |
| 2004/0012328 A1* | 1/2004 | Arnold et al. | 313/504 |
| 2004/0061136 A1 | 4/2004 | Tyan et al. | |
| 2006/0186802 A1* | 8/2006 | Cok et al. | 313/506 |
| 2006/0232195 A1* | 10/2006 | Cok et al. | 313/504 |
| 2006/0244371 A1* | 11/2006 | Cok et al. | 313/506 |
| 2006/0250084 A1* | 11/2006 | Cok et al. | 313/512 |
| 2006/0290271 A1* | 12/2006 | Cok | 313/504 |
| 2007/0013291 A1* | 1/2007 | Cok et al. | 313/501 |
| 2007/0013293 A1* | 1/2007 | Cok | 313/504 |

OTHER PUBLICATIONS

C. W. Tang and S. A. VanSlyke; "Organic Electroluminescent Diodes"; Applied Physics Letter; vol. 51; No. 12; Sep. 21, 1987; pp. 913-915.
C. W. Tang, S. A. VanSlyke, and C. H. Chen; "Electroluminescence Of Doped Organic Thin Films"; Journal Applied Physics; vol. 65; No. 9; May 1, 1989; pp. 3610-3616.
U.S. Appl. No. 11/065,082, filed Feb. 24, 2005; "OLED Device Having Improved Light Output"; of Ronald S. Cok, Donald R. Preuss, and Yuan-Sheng Tyan.

* cited by examiner

*Primary Examiner*—Joseph L Williams
*Assistant Examiner*—Kevin Quarterman
(74) *Attorney, Agent, or Firm*—Raymond L. Owens (57) ABSTRACT

An organic light-emitting diode (OLED) device, comprising: first and second transparent electrodes, and one or more layers of organic material formed between the first and second transparent electrodes, the layers of organic material including one or more light-emitting layers; a reflective layer having a surface plasmon-polariton-supporting reflective surface located on a side of either of the first or second transparent electrodes opposite to the organic material layers; and a scattering layer in optical contact with the organic material layers and the electrodes. In certain embodiments, layer spacing is preferably designed such that the distance between the reflective surface and at least one of the one or more light-emitting layers is equal to or greater than 60 nm. Additionally, a low-index layer is preferably employed in various embodiments to improve device sharpness.

18 Claims, 10 Drawing Sheets

OLED DEVICE HAVING IMPROVED LIGHT OUTPUT

FIELD OF THE INVENTION

The present invention relates to organic light-emitting diode (OLED) devices, and more particularly, to OLED device structures for improving light output.

BACKGROUND OF THE INVENTION

Organic light-emitting diodes (OLEDs) are a promising technology for flat-panel displays and area illumination lamps and backlights. The technology relies upon thin-film layers of materials coated upon a substrate. However, as is well known, much of the light output from the light-emissive layer in the OLED is absorbed within the device. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic electroluminescent (EL) element, and a cathode. The organic EL element disposed between the anode and the cathode commonly includes one or more of an organic hole-injection layer (HIL), an organic hole-transporting layer (HTL), an emissive layer (EML), an organic electron-transporting layer (ETL) and an organic electron-injection layer (EIL). Holes and electrons recombine and emit light in the EML layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes recombine and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. In most cases, these trapped photons are eventually absorbed, never leaving the OLED device, although some of these photons may escape from the edge of the device. In either case, they make no contribution to the useful light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent (or semitransparent) cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. Using ray optics, it has been estimated that nearly 60% of the generated light is trapped by internal reflection in the ITO/organic EL element, 20% is trapped in the glass substrate, and only about 20% of the generated light is actually emitted from the device and performs useful functions.

Figure 2:
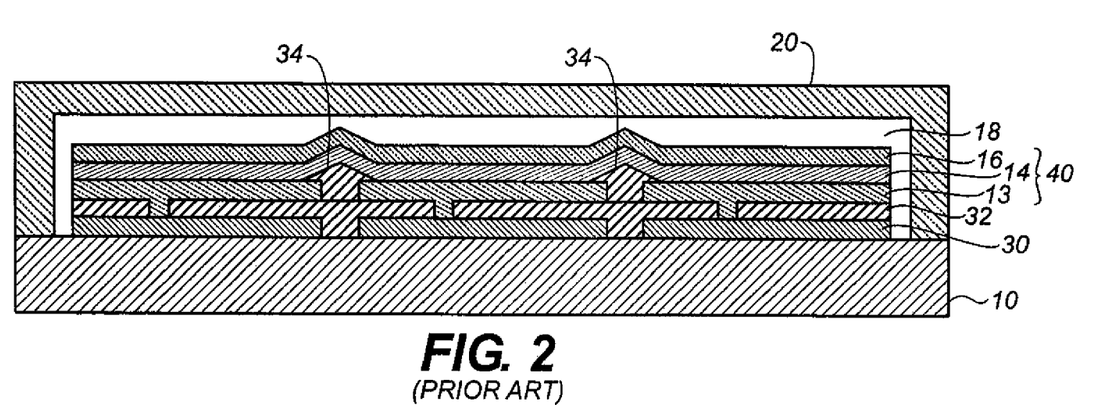
FIG. 2 illustrates a cross section of a top-emitter OLED device as suggested in the prior art.

Referring to FIG. 2, a top-emitting OLED device as suggested by the prior art is illustrated having a substrate 10 (either reflective, transparent, or opaque). Over the substrate 10, a semiconducting layer is formed providing thin-film electronic components 30 for driving an OLED. An interlayer insulating and planarizing layer 32 is formed over the thin-film electronic components 30 and a first patterned reflective electrode 13 defining OLED light-emissive elements is formed over the insulating layer 32. An inter-pixel insulating film 34 separates the elements of the patterned reflective electrode 13. One or more first layers 14 of organic materials described above, one of which emits light, are formed over the patterned reflective electrode 13. A transparent second electrode 16 is formed over the one or more first layers 14 of organic material. A gap 18 separates the transparent second electrode 16 from an encapsulating cover 20. The encapsulating cover 20 is transparent and may be coated directly over the transparent electrode 16 so that no gap 18 exists. In some prior-art embodiments, the first reflective electrode 13 may instead be at least partially transparent and/or light absorbing. In a bottom-emitter embodiment, the substrate is transparent and the positions of the transparent and reflective electrodes are reversed. Typically, the reflective metal electrode 12 comprises Al, Ag, Mg, or alloys of these or other reflective metals. The transparent electrode 16 may comprise ITO or other transparent and conductive metal oxides. A semitransparent electrode, e.g. formed from thin metal layers, such as Ag, may also form all or part of this electrode.

Figure 6:
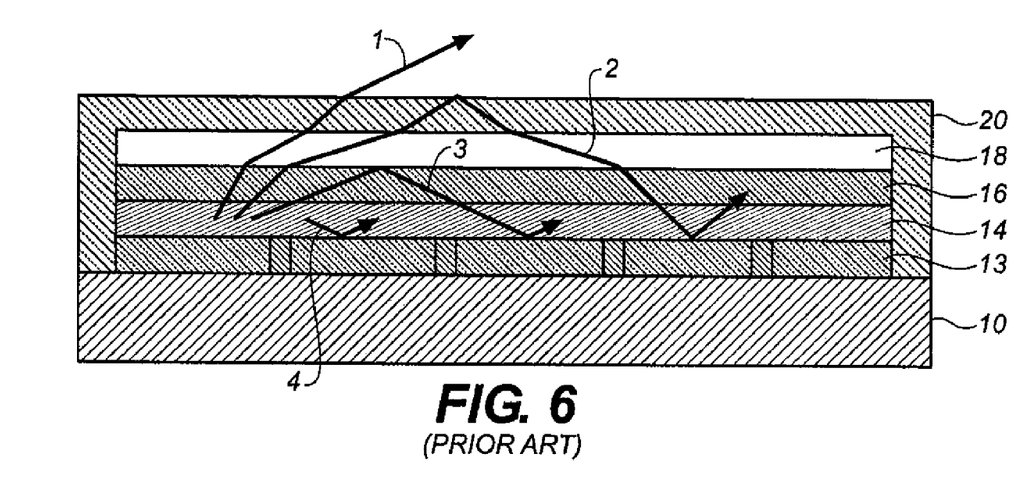
FIG. 6 illustrates different modes of light propagation through a cross section of a top-emitter OLED device.
Figure 7:
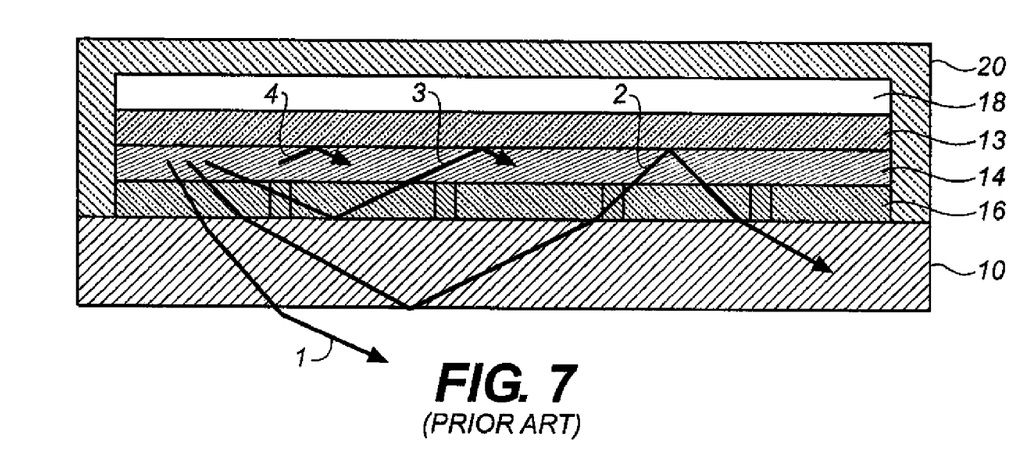
FIG. 7 illustrates different modes of light propagation through a cross section of a bottom-emitter OLED device.

As shown in a simpler form in FIG. 6 (for a top-emitter embodiment) and FIG. 7 (for a bottom-emitter embodiment), light emitted from one of the organic material layers 14 can be emitted directly out of the device, through the substrate 10 or cover 20, as illustrated with light ray 1. If the gap 18 either does not exist or is filled with a material whose optical index matches that of the cover or substrate, light may also be emitted and internally guided in the substrate 10 or cover 20 and organic layers 14, as illustrated with light ray 2. Alternatively, light may be emitted and internally guided in the organic layers 14 and electrode 16, as illustrated with light ray 3. Light rays 4 emitted toward the reflective electrode 13 are reflected by the reflective electrode 13 toward the substrate 10 or cover 20 and then follow one of the light ray paths 1, 2, or 3. Light emitted in these paths may be termed Modes I, II, and III light respectively.

Figure 8:
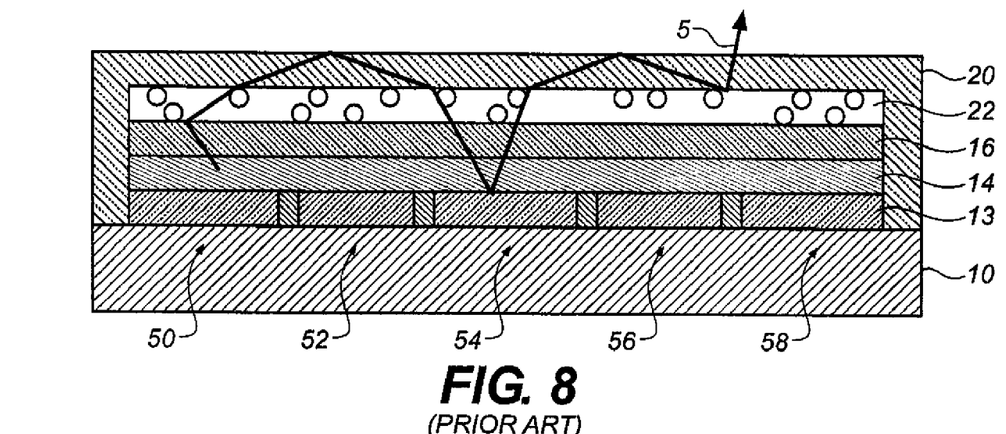
FIG. 8 illustrates light propagation through a cross section of a prior-art top-emitter OLED device resulting in a lack of sharpness.
Figure 9:
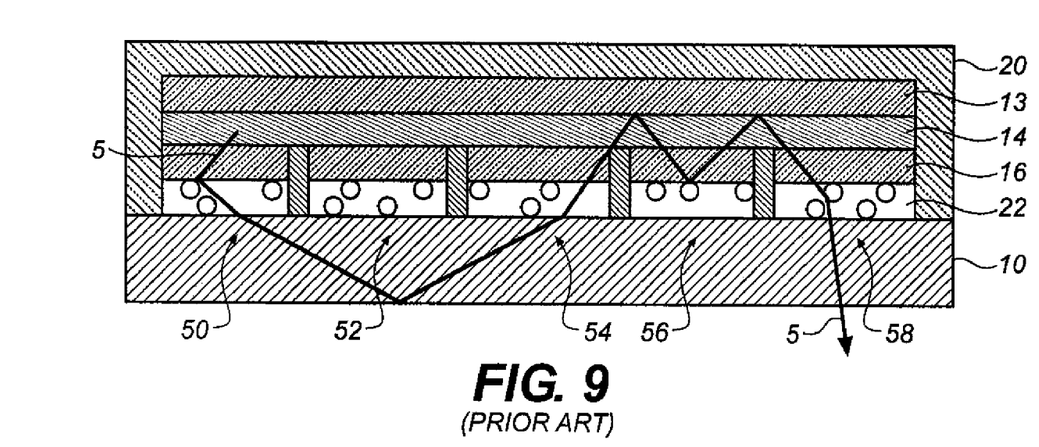
FIG. 9 illustrates light propagation through a cross section of a prior-art bottom-emitter OLED device resulting in a lack of sharpness.

A variety of techniques have been proposed to improve the out-coupling of light from thin-film light emitting devices. In particular, scattering layers employed in optical contact with the OLED layers can disrupt total internal reflection of light within the OLED device and increase the amount of light emitted from an OLED device. However, scattering techniques, by themselves, cause light to pass through the light-absorbing material layers multiple times where they can be absorbed and converted to heat. Moreover, trapped light may propagate a considerable distance horizontally through the cover, substrate, or organic layers before being scattered out of the device, thereby reducing the sharpness of the device in pixelated applications such as displays. For example, as illustrated in FIG. 8, a prior-art pixelated top-emitting OLED device may include a plurality of independently controlled pixels 50, 52, 54, 56, and 58 and a scattering layer 22 located between the cover 20 and the transparent electrode 16. A light ray 5 emitted from the light-emitting layer may be scattered multiple times by scattering layer 22, while traveling through the cover 20, organic layer(s) 14, and transparent electrode 16 before it is emitted from the device. When the light ray 5 is finally emitted from the device, the light ray 5 has traveled a considerable distance through the various device layers from the original pixel 50 location where it originated to a remote pixel 58 where it is emitted, thus reducing sharpness. Most of the lateral travel occurs in the cover 20, because that is by far the thickest layer in the package. (Note that the layer thicknesses in this figure have not been drawn to scale since the thickness differences of the various layers is too great to permit depiction to scale.) Also, the amount of light emitted is reduced due to absorption of light in the various layers. If the light-scattering layer is alternatively placed adjacent to the substrate 10 of a prior-art bottom-emitting device as illustrated in FIG. 9, the light may similarly travel a significant distance in the substrate 10 before being emitted.

U.S. Patent Application Publication No. 2004/0061136 entitled "Organic light emitting device having enhanced light extraction efficiency" by Tyan et al., describes an enhanced light extraction OLED device that includes a light scattering layer. Two transparent electrodes may be employed, along with the use of a reflective layer, such as a metal layer, behind one of the transparent electrodes. In certain embodiments, a low index isolation layer (having an optical index substantially lower than that of the organic electroluminescent element) is employed adjacent to a reflective layer in combination with the light scattering layer to prevent high angle (with respect to the normal) light from striking the reflective layer, and thereby minimize absorption losses due to multiple reflections from the reflective layer. The particular arrangements, however, may still result in reduced sharpness of the device and incomplete light extraction.

Figure 10:
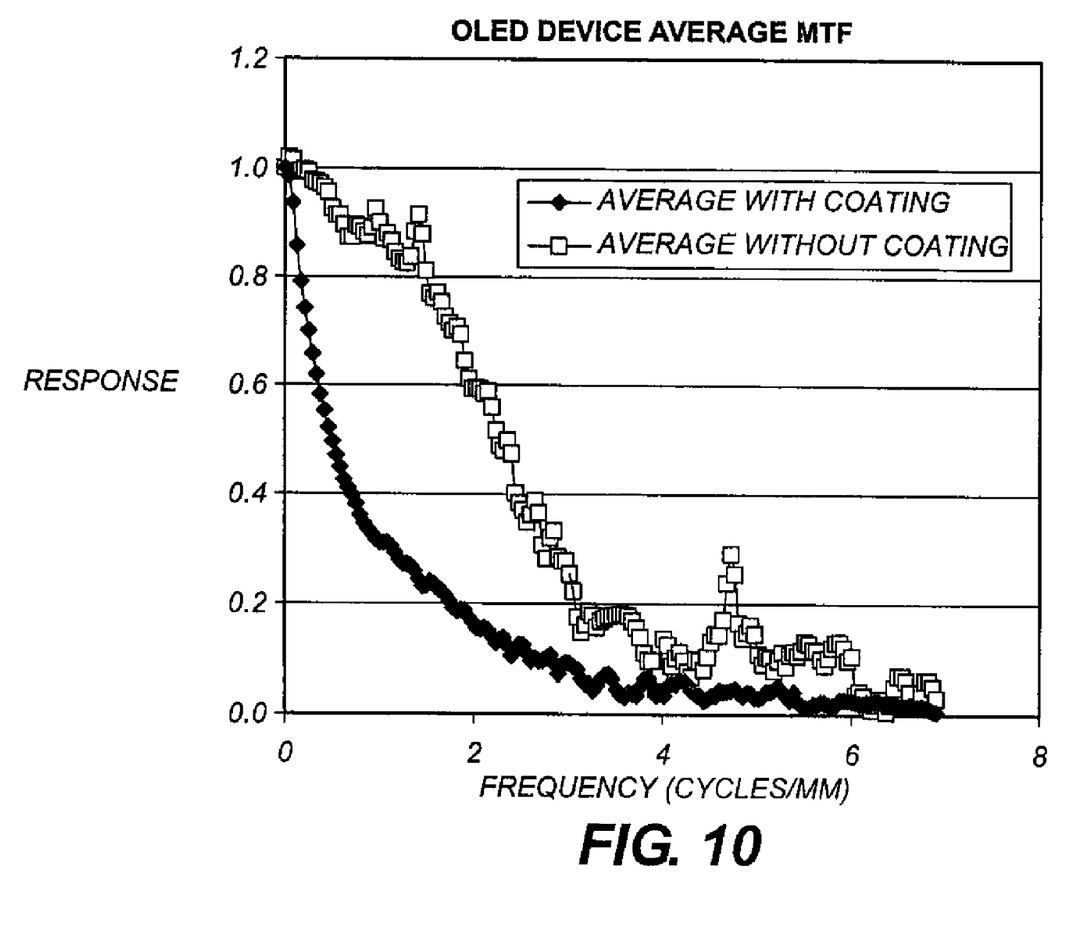
FIG. 10 is a graph demonstrating the loss in sharpness due to a scattering layer in a prior-art active-matrix bottom-emitting OLED device.

Referring to FIG. 10, e.g., the sharpness of a bottom-emitting active matrix OLED device employing a light-scattering layer coated on the substrate is illustrated. The average MTF (sharpness) of the device (in both horizontal and vertical directions) is plotted for an OLED device with the light-scattering layer and without the light-scattering layer. As is shown, the device with the light-scattering layer is much less sharp than the device without the light-scattering layer, although more light was extracted (not shown) from the OLED device with the light-scattering layer. FIG. 10 thus illustrates the reduction in sharpness that occurs when scattering layers are employed as taught in the prior art.

A variety of means for increasing the light output from OLED devices have been proposed. One such technique relies upon forming an optical cavity to increase light output and to control the color of the light output. For example, U.S. Pat. No. 6,737,800B1 describes a multicolor organic light-emitting display having an array of pixels having at least two different colors including a substrate; a reflective layer disposed over the substrate; and a first transparent electrode disposed over the reflective layer. The display also includes a second transparent electrode spaced from the first transparent electrode and an organic EL media disposed between the first and second transparent electrodes and arranged to produce white light. The display further includes at least first and second filters of different colors disposed respectively over different predetermined pixels of the array, and wherein the thickness of the first transparent electrode is separately adjusted for each different color to cause a substantial amount of the reflected component of colored light corresponding to its associated color filter to constructively interfere with a substantial amount of the non-reflected component of colored light corresponding to its associated color filter. However, such OLED designs suffer from manufacturing tolerance difficulties and the color of the light emitted from the device generally depends quite strongly on the angle of emission.

To simultaneously increase the amount of light output from an OLED device and preserve the sharpness and color of a pixellated OLED display device at a variety of viewing angles, co-pending, commonly assigned U.S. Ser. No. 11/065,082, filed Feb. 24, 2005, the disclosure of which is hereby incorporated by reference, describes the use of a scattering layer in combination with a transparent low-index element having a refractive index lower than the refractive index of the encapsulating cover or substrate through which light is emitted from the OLED device and lower than the refractive index range of the OLED element materials. Note that use of such a design is incompatible with optical cavity designs, however, as the scattering layer would destroy the constructive interference upon which such optical cavities rely.

Even the combined use of scattering and low-index layers, however, does not result in the emission of all of the light produced in OLED devices employing a conventional metallic reflective electrode. An electro-dynamic physical and optical model created by applicants demonstrates that the emission of light in the OLED structure employing scattering layers still results in considerable light being lost in the metallic reflective electrode through the formation of surface plasmons. An attempt to extract surface plasmons from an OLED device in the form of useful light is described in granted U.S. Pat. No. 6,670,772. However, the solution proposed requires very precise manufacturing tolerances and creates a very strong angular dependence on the color of light emitted.

There is a need therefore for an improved organic light-emitting diode device structure that avoids the problems noted above and improves the efficiency and sharpness of the device.

SUMMARY OF THE INVENTION

In accordance with one embodiment, the invention is directed towards an organic light-emitting diode (OLED) device, comprising: first and second transparent electrodes, and one or more layers of organic material formed between the first and second transparent electrodes, the layers of organic material including one or more light-emitting layers; a reflective layer having a surface plasmon-polariton-supporting reflective surface located on a side of either of the first or second transparent electrodes opposite to the organic material layers; and a scattering layer in optical contact with the organic material layers and the electrodes, wherein the distance between the reflective surface and at least one of the one or more light-emitting layers is equal to or greater than 60 nm. Additionally, a low-index layer is preferably employed in various embodiments to improve device sharpness.

ADVANTAGES

Various embodiments of the present invention have the advantages of increasing the light output from, while maintaining the sharpness of, an OLED device.

BRIEF DESCRIPTION OF THE DRAWINGS

It will be understood that the figures are not to scale since the individual layers are too thin and the thickness differences of various layers too great to permit depiction to scale.

DETAILED DESCRIPTION OF THE INVENTION

As described above, light generated within an OLED device can be emitted from the device, confined in the substrate or cover, or confined in the organic layers and electrodes. Materials having free electrons in the conduction band, for example metals, support formation of surface plasmons-polaritons in the presence of a radiating dipole. In the visible portion of the electromagnetic spectrum, such materials typically also have a dielectric constant with a negative real part. Accordingly, if a metallic, light-reflective electrode layer surface is located in proximity to an OLED emissive layer, some electrical energy may be converted to optical energy by the dipole that may then excite surface plasmons-polaritons (SP) at the metallic layer surface. Although it is true that SP modes are waveguide modes, the nature of SP waveguide modes differs significantly from that of Modes I, II, or III emitted light. First of all, the electromagnetic fields of SP modes are confined very closely to the dielectric/metal interface (i.e., the metal electrode/organic layer interface) whereas the fields of Mode III waveguide modes are distributed throughout the OLED waveguide core. (The OLED waveguide core is defined as the combined EIL, ETL, emissive layer(s), HTL, and transparent electrode layers.) A second difference between Mode III and SP waveguide modes is that both the real and imaginary parts of the complex effective indexes, $n_{eff}$, of these two modes are quite different. Mode III waveguide modes are characterized by $n_{glass}$<Real($n_{eff}$)<Real($n_{core}$), where $n_{glass}$ is the refractive index of the glass substrate and $n_{core}$ is the index of refraction of the core medium that has the largest real part. On the other hand, Real($n_{eff}$)> Real($n_{core}$) for SP waveguide modes. In addition, Imaginary ($n_{eff}$) for SP modes is considerably larger than that of Mode III modes. This is another way of stating the fact that SP modes exhibit more loss than do Mode III modes. Finally, Mode III waveguide modes can be either transverse-electric (TE) or transverse magnetic (TM) polarized whereas SP waveguide modes can only be TM polarized. Furthermore, the surface plasmons couple to the bulk plasmons, which are non-radiative. Henceforth, SP modes will be referred to as "Mode IV" energy, in keeping with the spirit of the previously-developed emitted light nomenclature.

Applicants have developed a mathematical model that describes the energy output from a radiating dipole in an OLED structure in terms of coupling into the various modes. This model describes the excitonic sources in OLED devices as classical point dipole harmonic oscillators that are embedded in a dielectric medium with no light absorption that is bounded on both sides by planar metal and/or dielectric layers. According to the model, each dipole interacts with the surrounding OLED structure by virtue of its own electromagnetic radiation, which is reflected back by the surrounding structure. In this way, the dipole does work on the surrounding structure which results in modification of the radiative damping that the dipole would otherwise experience in a completely uniform dielectric medium (e.g. free space). The power spectrum specifies the power emitted by the dipole as a function u, where $u=k_p/k$ is the transverse (in-plane) wavenumber normalized with respect to the free-photon wavenumber in the emitting medium. As demonstrated by the model, the radiation pattern as well as the total amount of power radiated by a radiating dipole can be severely modified by the presence of surrounding metallic and light-absorbing dielectric layers. In this model, it is assumed that the core waveguide thickness is held constant and the dipole sources are located in a very thin emissive layer. The dielectric materials between the electrodes are presumed to be non-absorbing. The spectra may then be computed for several values of $x_s$, the distance between the emissive layer and a metal layer.

The structure modeled employs, in order, an air cover, a reflective metal electrode, an electron-transport layer, a light-emissive layer, a hole-transport layer, a transparent electrode, and a glass substrate. In this model, the optical indices of typical OLED materials found in the prior art are employed. Glass having an index of 1.4610 is used for the substrate, the transparent electrode is presumed to be ITO having an index of 1.8029+0.0001i, the hole transport layer is presumed to comprise NPB having an optical index of 1.8259 with no imaginary part, the electron transport layer is presumed to comprise $Alq_3$, with an index of 1.7419, and the reflective electrode is presumed to comprise MgAg having an index of 0.5247+3.8264i. The emissive layer is assumed to be infinitesimally thin and located at the ETL/HTL junction and the wavelength is assumed to be 528 nm.

Figure 11:
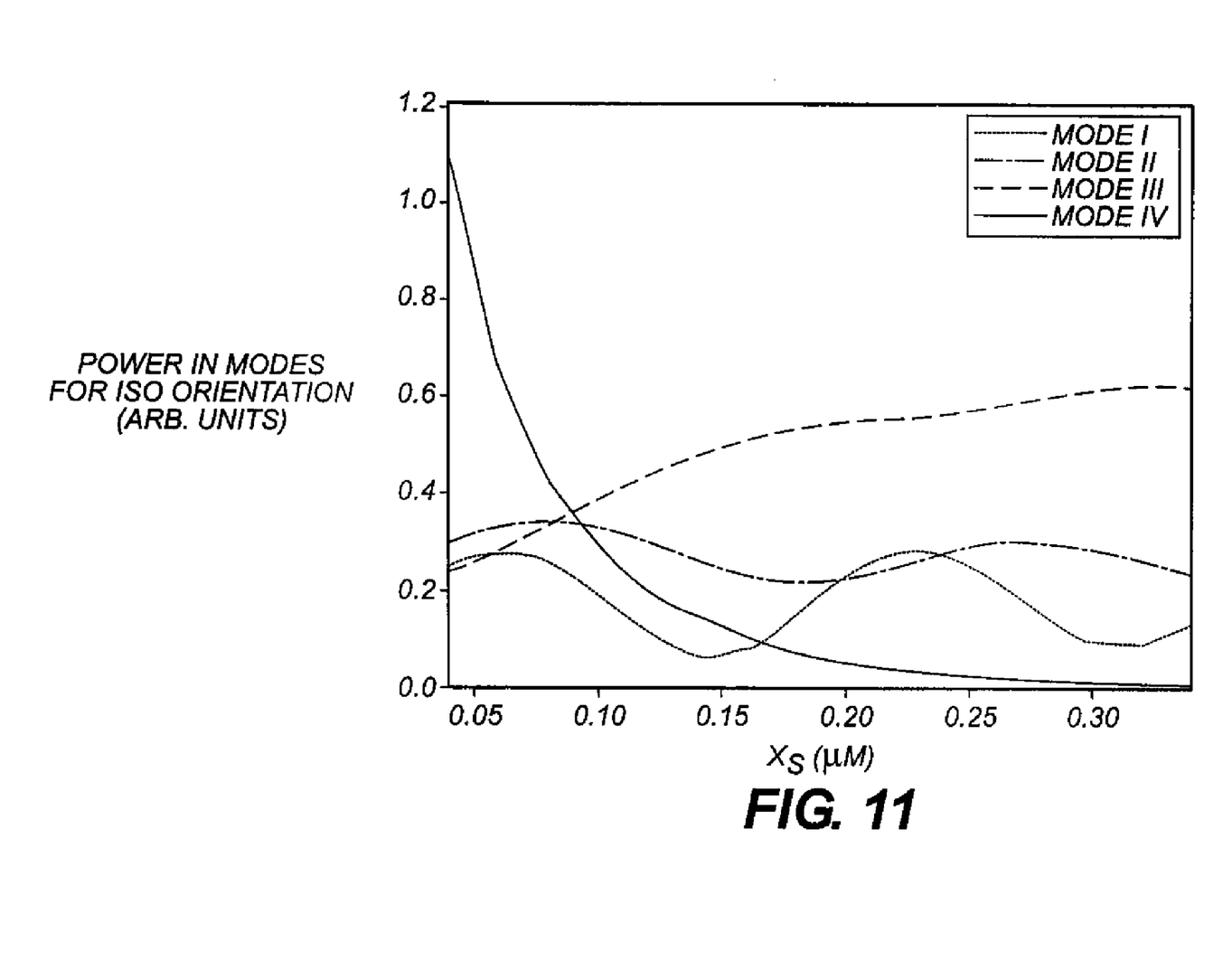
FIG. 11 is a graph demonstrating the relative energy in various modes of light as a function of layer separation.

Referring to FIG. 11, the model is employed to create a graph of the relative amounts of energy emitted into the various modes for the structure described above. By comparing the relative amount of energy in the surface-plasmon mode to the other modes, it can be seen that a high percentage of energy may be trapped in surface plasmons. In FIG. 11 the power in each mode is plotted as a function of $x_s$, the distance between the emissive layer and the metal surface. As can be seen from an examination of the graph, for the OLED device, the amount of energy coupled into the surface plasmon mode IV decreases as a result of increasing distance $x_s$, while the mode III energy increases. However, mode III light is not emitted from the OLED device but rather is trapped within the organic and transparent electrode layers.

Figure 12:
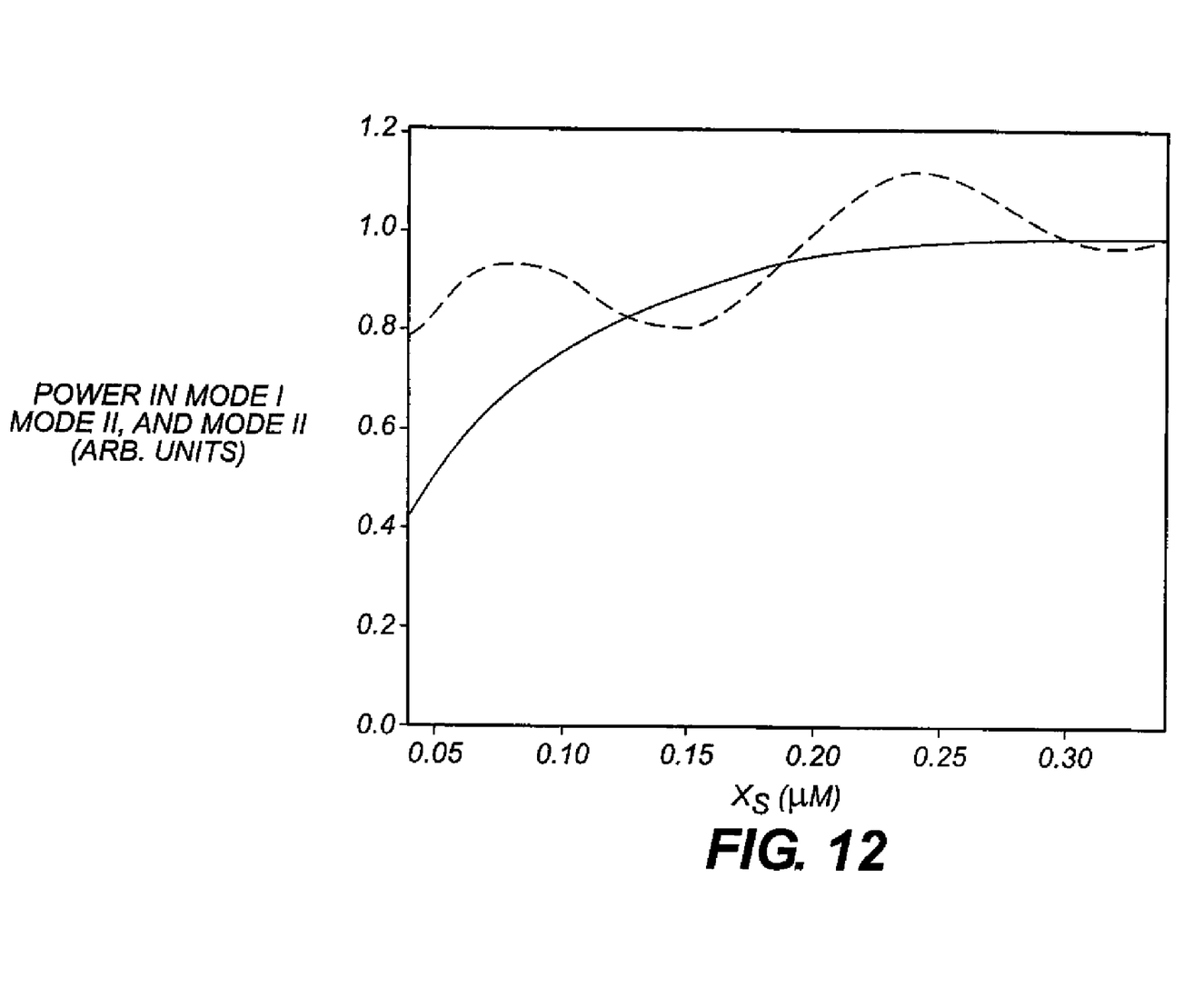
FIG. 12 is a graph demonstrating the total amount of light energy in Modes I, II, and III as a function of layer separation.

The amount of light emitted into the modes I, II, and III depends, in part, on the efficiency of converting electrical to radiative optical power of the OLED materials that form light-emitting dipoles. Physically, this is because in a device with a highly efficient emitter, more energy going into mode 4 (plasmon excitations) necessarily results in less total energy going into modes I, II, and III; however, for a device with a very low-efficiency emitter, the plasmons can instead be excited at the expense of the various non-radiative loss mechanisms that are resulting in the emitter's low efficiency. Referring to FIG. 12, the two extreme cases comparing the total energy emitted into modes I, II, and III are plotted as a function of $x_s$. One case is for a very high-efficiency (theoretically maximum) material and the other is for a very low-efficiency (theoretically minimum) material. The high-efficiency curve was obtained by assuming that the same amount of power (one arbitrary unit) was distributed among Modes I-IV for all values of $x_s$. The low-efficiency curve was obtained by assuming constant amplitude of oscillation for the dipole oscillators. In the latter case, the total power in Modes I-IV varies with $x_s$. The low-efficiency curve is normalized such that the total power in Modes I-IV is one arbitrary unit for $x_s$=340 nm.

As can be seen from an examination of the FIG. 12, with a very low-efficiency material (dashed curve), the total energy in modes I, II, and III is locally maximized at $x_s$ of approximately 80 and 240 nm while, for a very high-efficiency material the total energy increases monotonically with increasing $x_s$. Since high-efficiency materials will clearly be more desirable in designing efficient OLED devices, as a general rule a larger $x_s$ is preferred. The greatest increases in energy are found as $x_s$ increases from 40 nm to 60 nm, while further, still significant, increases in energy are found as $x_s$ increases from 60 to 80 nm, from 80 to 120 nm, from 120 nm to 160 nm, and then from 160 to 240 nm. As the distance increases beyond 160 nm to 240 nm or to higher values, an emission of energy into modes I, II, and III approaching 100% is found.

The results of this model predict that emitted energy from the OLED dipoles may be increased by increasing $x_s$. However, that does not necessarily imply that more light will be emitted from an OLED device employing an increased $x_s$. As noted above, and shown in FIG. 11, the mode III energy increases for 40 nm<$x_s$<240 nm, but both the modes I and II energies exhibit oscillating behavior with $x_s$). Hence, absent countervailing measures, an OLED device with an increase in $x_s$ will experience reduced light output. However, as taught in the present invention, by employing a light-scattering layer in combination with an $x_s$ of at least 60 nanometers, an increased level of emitted light may be obtained.

While light reflective layers are typically employed in OLED devices to redirect light to the intended emission side of the device, as discussed above their use may also support the undesired absorption of energy into surface plasmon-polariton modes. While increasing the distance between a metallic electrode and a light-emitting layer by employing a thicker hole- or electron-transport layer may be possible, such a thicker organic layer will result in increased voltages and light absorption. According to an embodiment of the present invention, in order to increase the distance $x_s$ between a light emitting layer and a surface plasmon-supporting reflective surface to at least 60 nanometers, a transparent electrode may be employed between the light-emitting layer and the surface plasmon-supporting reflective surface. In such an embodiment, an organic light-emitting diode (OLED) device may comprise first and second transparent electrodes, and one or more layers of organic material formed between the first and second transparent electrodes, the layers of organic material including one or more light-emitting layers; a reflective layer having a plasmon-supporting reflective surface located on a side of either of the first or second transparent electrodes opposite to the organic material layers; and a scattering layer in optical contact with the organic material layers and either of the electrodes.

Figure 1:
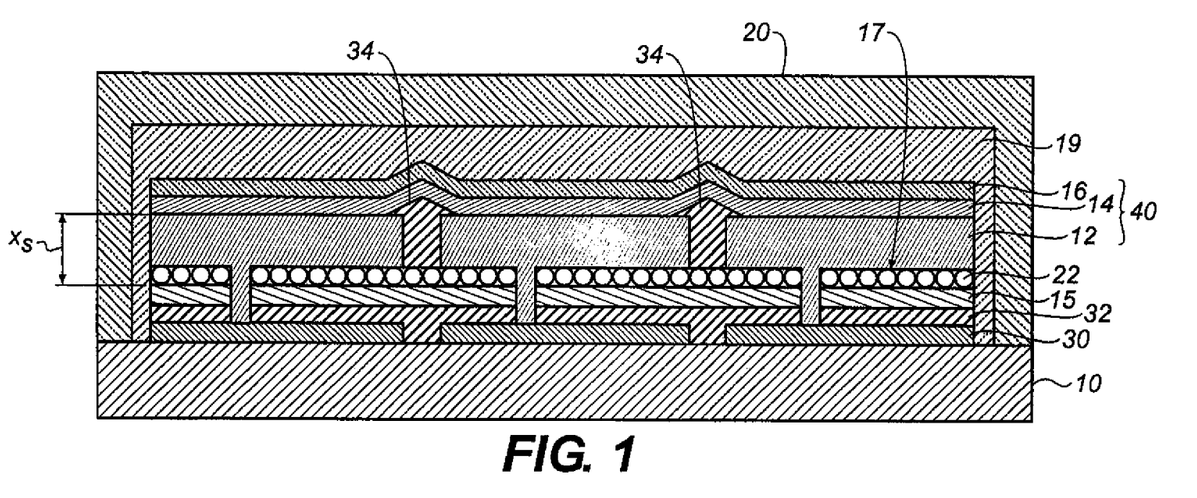
FIG. 1 illustrates a cross section of a top-emitter OLED device having a scattering layer and extended layer spacing between a reflective surface and a light-emitting layer according to one embodiment of the present invention.
Figure 5A:
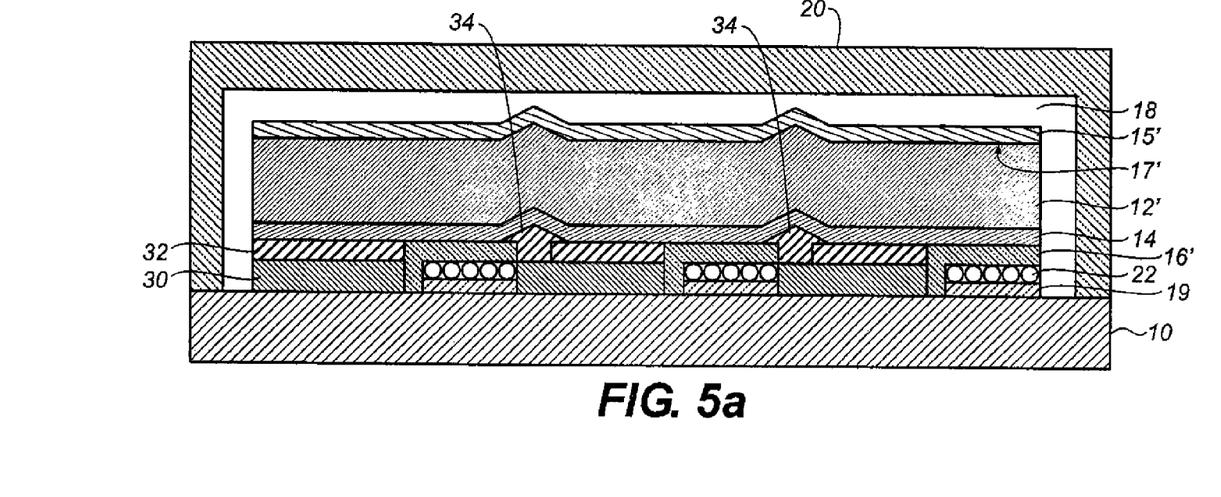
FIGS. 5a-5c illustrate cross sections of a bottom-emitter OLED device having a scattering layer and extended layer spacing according to various embodiments of the present invention.

Referring to FIG. 1, a top-emitting organic light-emitting diode (OLED) device, comprises a substrate 10; a reflective layer 15 having a reflective surface 17, an OLED 40 comprising first and second transparent electrodes 12 and 16 respectively, and one or more layers 14 of organic material formed between the electrodes 12 and 16, at least one layer of organic material emitting light; a scattering layer 22 in optical contact with the organic layers 14 and/or the electrodes 12 and 16. An encapsulating cover 20 encapsulates and protects the OLED materials and electrodes. A transparent low-index element 19 (possibly an air gap) having a refractive index lower than the refractive index of the encapsulating cover through which light is emitted from the OLED device and lower than the refractive index range of the OLED element materials may be employed between the transparent electrode 16 and the cover 20 to improve the sharpness of the OLED device, as is disclosed in co-pending, commonly assigned U.S. Ser. No. 11/065,082, filed Feb. 24, 2005, the disclosure of which is hereby incorporated by reference. Since the low-index element or gap 19 has an optical index lower than that of the OLED elements and the cover 20, any light that is scattered into the gap 19 by the scattering layer will pass through the gap and the cover 20, since light passing from a low-index material (the gap 19) into a higher index material (the cover 20) cannot experience total internal reflection, although it can still experience the much smaller Fresnel reflection. Alternatively, as illustrated in FIG. 5a, a low-index layer 19 may be employed under the scattering layer 22 in a bottom-emitting embodiment.

In accordance with the present invention, the distance $x_s$ between the light-emitting layer of the organic layers 14 and the reflective surface 17 is equal to or greater than 60 nm. In some embodiments, the distance $x_s$ may more preferably be equal to or greater than 80, 100, 120, 140, 160, 180, 200, 220, or 240 nm, and in general is preferably less than 280 nm as greater distances have little effect on surface plasmon excitation. By optical contact it is meant that there are no intervening layers having an optical index lower than the optical index of any of the organic and transparent electrode layers and that light that passes through any one of the layers will encounter the scattering layer. The one or more organic layers may include one or more of the following layers: a hole-injection layer, hole-transport layer, electron-injection layer, electron-transport layer, and a light-emitting layer. More than one emissive layer may be employed in the present invention, for example to create a white light output. If there are multiple emissive layers, then $x_s$ refers to the distance of the one that is closest to the reflective surface 17 of the metallic layer 15. These layers are well known in the OLED art.

The transparent electrodes 12 and 16 are non-metallic so as to be non-plasmon supporting, and accordingly may comprise any conductive materials having a dielectric constant with a positive real part or that do not have free electrons in a conduction band. For example, transparent electrodes 12 and 16 may comprise metal oxides such as indium tin oxide, or indium zinc oxide, or conductive polymers such as polythiophene.

Figure 3A:
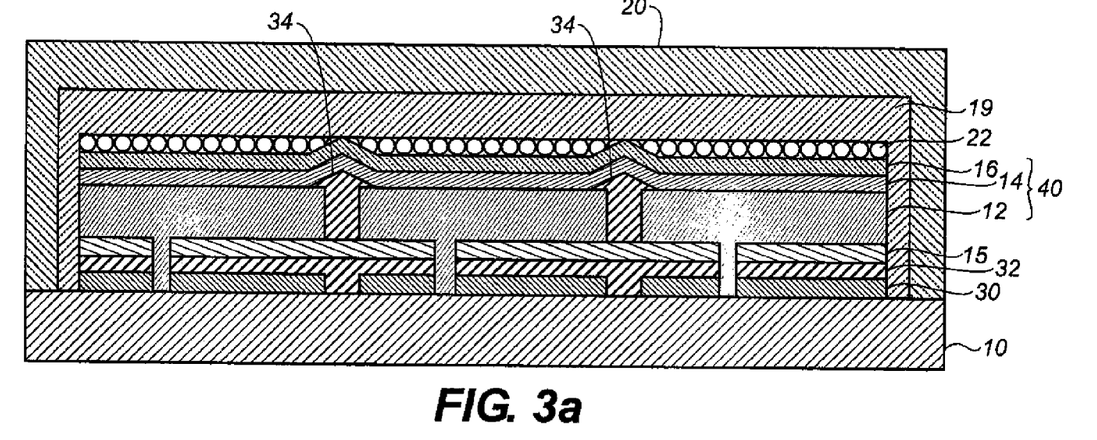
FIGS. 3a and 3b illustrate cross sections of a top-emitter OLED device having a scattering layer and extended layer spacing according to an alternative embodiment of the present invention.
Figure 3B:
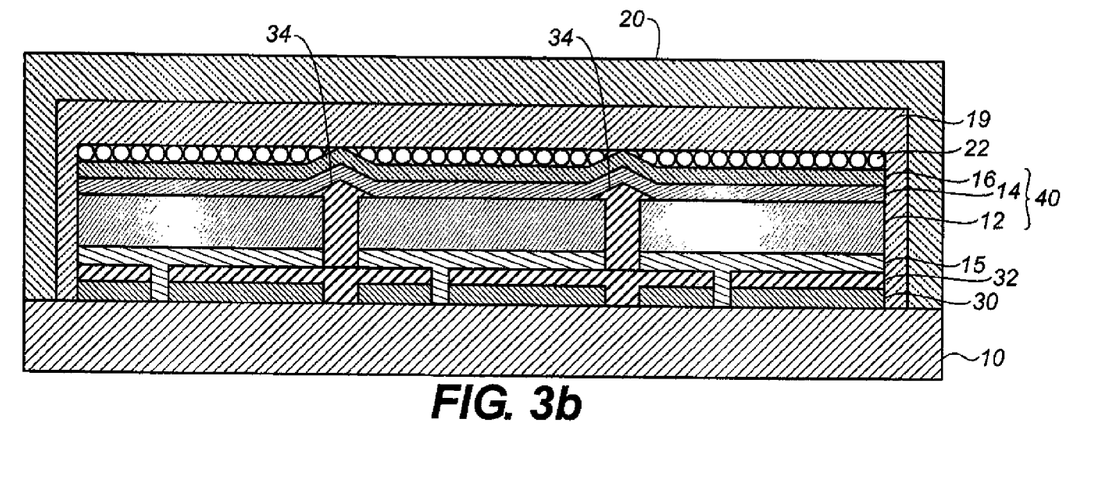

As shown in FIG. 1, the scattering layer 22 is located between the reflective surface 17 of reflective layer 15 and the first transparent electrode 12. The reflector 15 is typically composed of metal or metal alloys, for example, including aluminum, silver, or magnesium. The scattering layer 22 may be located between the transparent conductor 12 and the reflective layer 15 (as shown in FIG. 1) or, in alternative embodiments, for example as shown in FIGS. 3a and 3b, the transparent electrode 16 may be adjacent to and in contact with the scattering layer 22 and located between the scattering layer 22 and the organic layer(s) 14. In other embodiments, the scattering layer 22 is located adjacent to or between the transparent electrodes.

In FIG. 3a, the transparent electrode 12 is electrically connected to the thin-film electronic components 30 while in FIG. 3b, the reflective layer 15 is also electrically conductive and is electrically connected to the thin-film electronic components 30 as well as the transparent electrode 12. In preferred embodiments, the reflective layer 15 is partially, largely, or completely co-extensive with the first transparent electrode 12, thereby forming a two-layer electrode having a reflective portion and a transparent portion. Thus, the transparent electrode 12 serves as a spacer between the reflective surface of layer 15 and the light-emitting layer of the organic layers 14. In an alternative embodiment, additional layers, possibly conductive, may be formed between the reflective layer 15 and the transparent electrode 12. Such layers may be useful, for example, in improving adhesion or electrical compatibility between the layers. Where the scattering layer is employed between the transparent electrode 12 and a conductive reflective layer 15, conductive scattering particles, a conductive matrix, or vias may be employed to provide enhanced electrical connection between layers 12 and 15. When the scattering layer is adjacent to the reflective layer, it is not necessary for the scattering layer to be transparent.

Figure 4:
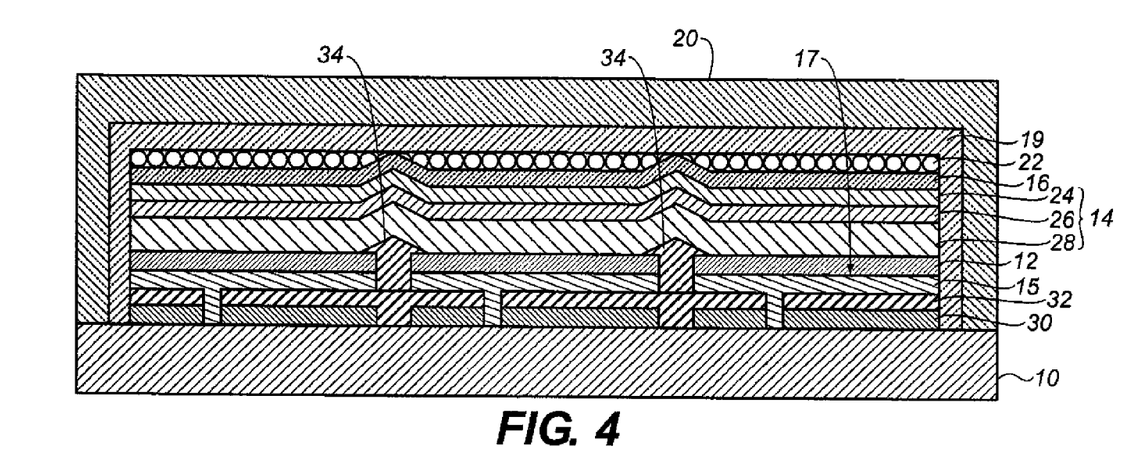
FIG. 4 illustrates a cross section of a top-emitter OLED device having a scattering layer and extended layer spacing according to another embodiment of the present invention.

The extended spacing $x_s$ may be provided in a variety of embodiments. In a first embodiment, as shown in FIG. 1, the transparent electrode 12 separates the reflective surface 17 from the light emissive layer(s) of the organic layers 14. To provide adequate separation, the transparent conductive layer 12 may preferably be between 10 nm and 280 nm, depending on the thickness of the various organic layers. Note that, as configured in FIG. 1, the hole injection and/or hole transport layers may also serve to separate the reflective surface 17 from the emissive layers. Hence, in alternative embodiments the hole injection and/or hole transport layers may also be thicker than in conventional designs. Referring to FIG. 4, the organic layer(s) 14 are shown in more detail, with a hole-injection and/or hole-transport layer 28, one or more emissive layers 26, and an electron transport and/or electron injection layer 24. In this embodiment, the hole-injection and/or hole-transport layer 28 has an extended thickness, for example greater than 20 nm to provide (in combination with transparent electrode layer 12) the desired separation between the reflective surface 17 and the light emitting layer 26 of the organic layer(s) 14. However, it is preferred that the thickness of the organic layers be as thin as possible (and more preferably having a thickness of less than that of the transparent electrode layer 12) to reduce the voltage drop across the layers (to reduce power consumption) while decreasing the likelihood of electrical shorts through the layers and thereby preserving manufacturability. The choice between these various embodiments may be affected by the relative conductivity and light absorption of the various layers. In general, more transparent and conductive materials are desired. It is possible to employ an extended thickness hole-injection and/or hole-transport layer 28 to reduce the excitation of surface plasmon-polaritons in a reflective metal electrode in the absence of a transparent electrode separating the thicker hole-injection and/or hole-transport layer and reflective metal electrode, but such a solution may unnecessarily increase the voltage, and hence power required by the OLED device.

The embodiments of FIGS. 1, 3a, 3b, and 4 are described as top-emitting OLED structures. In alternative embodiments, for example shown in FIGS. 5a, 5b, and 5c, a bottom-emitter structure may be employed. In this embodiment, an organic light-emitting diode (OLED) device comprises a substrate 10; a low-index layer 19 formed over the substrate, a scattering layer 22 formed over the low-index layer 19, a transparent electrode 16' formed over the scattering layer 22, one or more layers 14 of organic material formed over the transparent electrode 16', at least one layer of organic material emitting light, a transparent electrode 12' formed over the one or more layers 14 of organic material, and a reflective layer 15' having a reflective surface 17' formed over the transparent electrode 12'. The low-index layer 19 has an optical index lower than the organic materials 14.

Figure 5B:
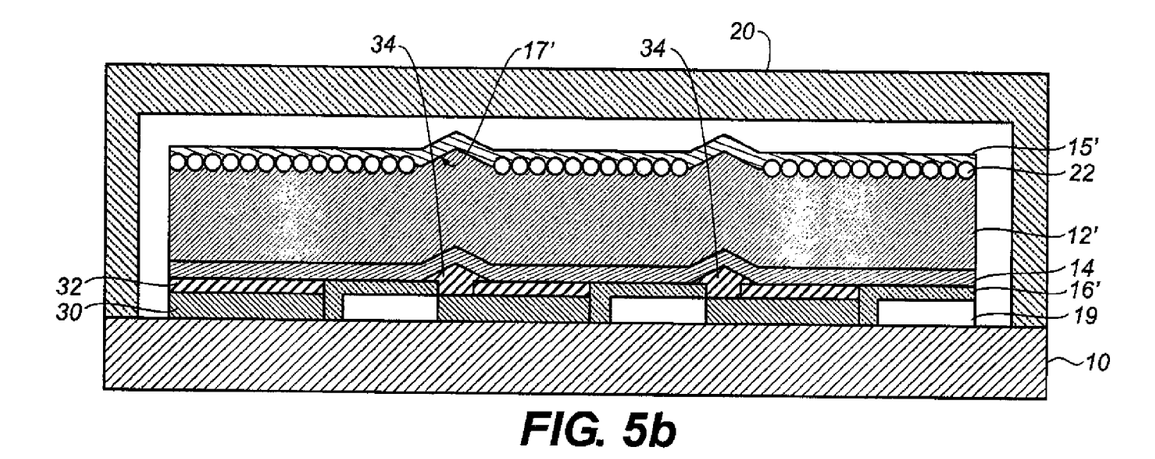
Figure 5C:
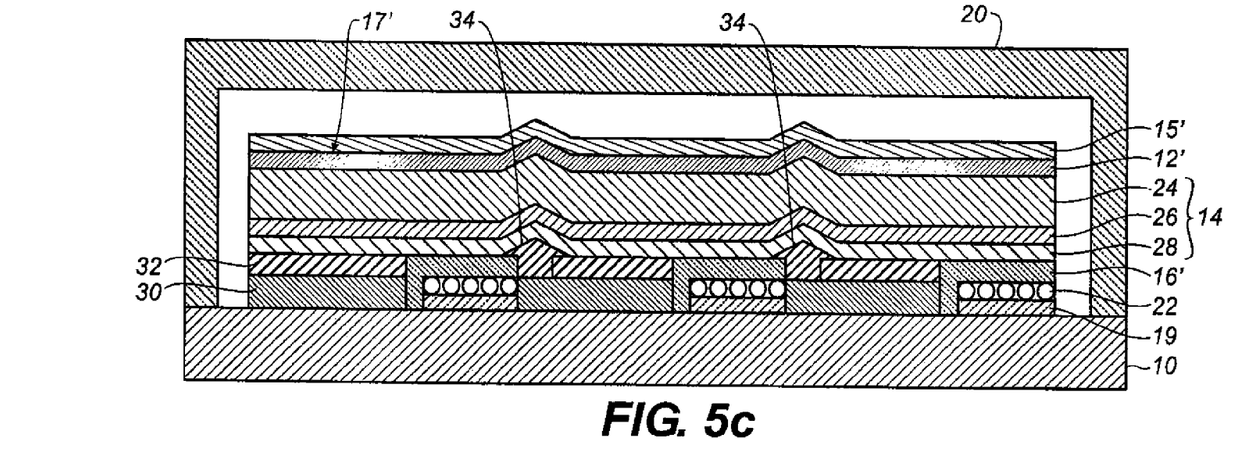

Referring to FIG. 5a, the transparent electrode 12' enables an extended spacing between the emissive layer of the one or more layers 14 and the reflective surface 17'. By adjusting the thickness of the transparent electrode 12', the desired separation may be obtained. Referring to FIG. 5c, in an alternative embodiment of the present invention, one or more of the organic layers may be made thicker enough to provide the desired separation in combination with use of transparent electrode layer 12'. As in FIG. 4, the organic layer(s) 14 in FIG. 5c are shown in more detail, with a hole-injection and/or hole-transport layer 28, one or more emissive layers 26, and an electron transport and/or electron injection layer 24. In this embodiment, the electron-injection and/or electron-transport layer 24 has an extended thickness, for example greater than 20 nm, to provide (in combination with transparent electrode layer 12') the desired separation between the reflective surface 17' and the light emitting layer(s) 26. However, it is preferred that the thickness of the organic layers be as thin as possible (and more preferably having a thickness of less than that of the transparent electrode layer 12) to reduce the voltage drop across the layers (to reduce power consumption) while decreasing the likelihood of electrical shorts through the layers and thereby preserving manufacturability. Referring to FIG. 5b, the scattering layer 22 may be located between the organic layer(s) 14 and the reflective layer 15'. In this alternative embodiment of the present invention, scattering layer 22 is located between the transparent electrode 12' and the reflective layer 15'. Similarly as in the top-emitter embodiments, it is possible to employ an extended thickness electron-injection and/or electron-transport layer 24 to reduce the excitation of surface plasmons in a reflective metal electrode in the absence of a transparent electrode separating the thicker electron-injection and/or electron-transport layer and reflective metal electrode, but again such a solution may unnecessarily increase the voltage, and hence power required by the OLED device.

Although the OLED layer structures of FIGS. 4 and 5c have been described with a cathode on the top and an anode on the bottom near the substrate, it is well known that the organic layers can be inverted and the positions of the anode and cathode exchanged. Such inverted structures are included within the scope of the present invention.

As employed herein, a light scattering layer is an optical layer or layer having a surface that tends to redirect any light that impinges on the layer or surface from any direction. The light scattering layer 22 is optically integrated into the OLED device for scattering light emitted by the light-emitting layers and reflected by the reflective layer 15. The presence of an optically integrated scattering layer 22 in accordance with the present invention defeats total internal reflection of emitted light that might otherwise propagate between and in the electrodes and organic layers of the OLED element. Optical integration of the scattering layer within the OLED device means that light emitted by an OLED element is redirected. For example, a light scattering layer integrated into a reflective electrode or reflector may scatter the reflected light and may be constructed with a rough surface rather than a smooth planar surface. If the light scattering element is integrated into a transparent layer, the light scattering element scatters the light that passes through the layer.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements having a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than approximately one-tenth the wavelength of the emitted light, then it is desirable for the index of refraction of at least one material in the scattering layer 22 to be approximately equal to or greater than the refractive indices of the organic layers 14. This is to insure that all of the light trapped in the organic and conductor layers can experience the direction altering effects of scattering layer 22. If scattering layer 22 has a thickness less than approximately one-tenth the wavelength of the emitted light, then the materials in the scattering layer need not have such a preference for their refractive indices.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 µm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

The scattering layer 22 should be selected to get the light out of the OLED as quickly as possible so as to reduce the opportunities for re-absorption by the various layers of the OLED device. If the scattering layer 22 is to be located between the organic layers 14 and the transparent low-index element 19, or between the organic layers 14 and a reflective layer 15, then the total diffuse transmittance of the same layer coated on a glass support should be high (preferably greater than 80%). In other embodiments, where the scattering layer 22 is itself desired to be reflective, then the total diffuse reflectance of the same layer coated on a glass support should be high (preferably greater than 80%). In all cases, the absorption of the scattering layer should be as low as possible (preferably less than 5%, and ideally 0%).

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, $MgO$, $ZnO$, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

One problem that may be encountered with such scattering layers is that the electrodes may tend to fail open at sharp edges associated with the scattering elements in the layer 22. Although the scattering layer may be planarized, typically such planarizing operations do not form a perfectly smooth, defect-free surface. To reduce the possibility of shorts between the transparent electrodes 12 and 16, a short-reduction layer (not shown) may be employed between an electrode and the organic layers, when the electrode is formed over the scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

Figure 13:
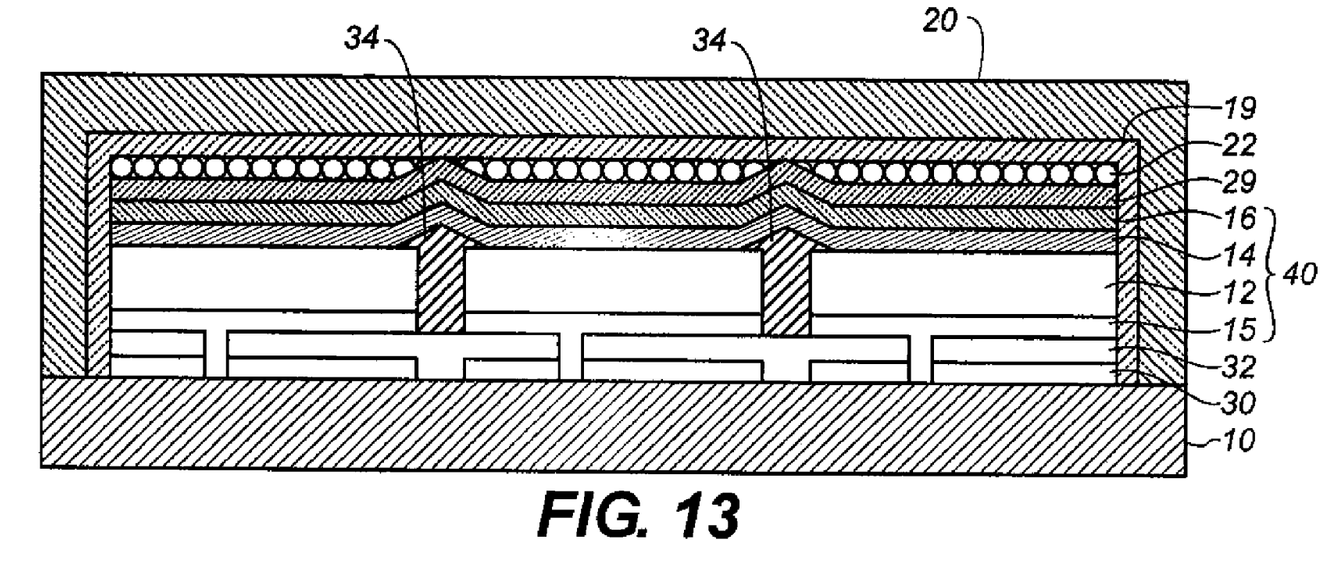
FIG. 13 is a cross section of an OLED device having a layer of encapsulating materials according to an embodiment of the present invention.

In particular, as illustrated in FIG. 13, one or more very thin layers of transparent encapsulating materials 29 may be deposited on the electrode 16. In this case, the scattering layer 22 may be deposited over the layers of encapsulating materials 29. This structure has the advantage of protecting the electrode 16 during the deposition of the scattering layer 22. Preferably, the layers of transparent encapsulating material 29 has refractive indices comparable to the first refractive index range of the transparent electrode and organic layers, or is very thin (e.g., less than about 0.2 micron) so that wave guided light in the transparent electrode and organic layers will pass through the layers of transparent encapsulating material 29 and be scattered by the scattering layer 22.

OLED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4, 5 light rays
10 substrate
12, 12' transparent electrode
13 reflective electrode
14 organic layer(s)
15, 15' reflective layer
16, 16' transparent electrode
17, 17' reflective surface
18 gap
19 transparent low-index element
20 encapsulating cover
22 scattering layer
24 electron-injection/electron-transport layer
26 emissive layer
28 hole-injection/hole-transport layer
29 layer of encapsulating material
30 thin-film circuitry
32 insulator
34 insulator
40 OLED element
50, 52, 54, 56, 58 pixels

The invention claimed is:

1. An organic light-emitting diode (OLED) device, comprising:
  first and second transparent electrodes, and one or more layers of organic material formed between the first and second transparent electrodes, the one or more layers of organic material including one or more light-emitting layers;
  a reflective layer having a surface plasmon-polariton-supporting reflective surface located on a side of either of the first or second transparent electrodes through which light is emitted from the device opposite to the and one or more organic material layers, the reflective layer being located on a side of the one or more layers of organic material opposite to the emission side of the device; and
  a scattering layer in optical contact with the one or more organic material layers and the first and second transparent electrode, wherein the scattering layer is on a side of the one or more light-emitting layers opposite the surface plasmon-polariton-supporting reflective surface, and
  wherein the distance between the surface plasmon-polariton-supporting reflective surface and at least one of the one or more light-emitting layers is equal to or greater than 60 nm.

2. The OLED device of claim 1, wherein the reflective layer comprises a metal or metal alloy.

3. The OLED device of claim 1, wherein the first and/or second transparent electrodes comprises a metal oxide.

4. The OLED device of claim 3, wherein the one or more layers of organic material additionally include one or more of a hole-injection layer, a hole-transport layer, an electron-injection layer, and an electron-transport layer.

5. The OLED device of claim 1, wherein the reflective layer is conductive and in electrical contact with one of the first or second transparent electrode.

6. The OLED device of claim 5, wherein the reflective layer is co-extensive with the one of the first or second transparent electrodes.

7. The OLED device of claim 1, wherein the distance between the surface plasmon-polariton-supporting reflective surface and at least one or more light-emitting layers is equal to or greater than 80 nm.

8. The OLED device of claim 1, wherein the distance between the at least one of the one or more light-emitting layers and the surface plasmon-polariton-supporting reflective surface is less than 280 nm.

9. The OLED device of claim 1, wherein the one or more organic material layers include hole-transport and hole-injection layers or electron-transport and electron-injection layers having a combined thickness of less than that of the first or second transparent electrode between the at least one of the one or more light-emitting layers and the surface Plasmon-polariton-supporting reflective surface.

10. The OLED device of claim 1, wherein the scattering layer is located between a first and second transparent electrode and the reflective layer.

11. The OLED device of claim 1, wherein one of the first or second transparent electrode is located between the scattering layer and the light-emitting layer and the other of the first or second transparent electrode is located between the reflective layer and the light-emitting layer.

12. The OLED device of claim 1, wherein the one or more organic material layers have a first optical index range, and further comprising a transparent low-index element having an optical index lower than the first optical index range, and wherein the scattering layer and the one or more organic material layers are located between the transparent low-index element and the reflective layer.

13. The OLED device of claim 12, further comprising a Substrate and a cover and wherein the transparent low-index element has an optical index lower than the cover or the substrate through which light is emitted.

14. The OLED device of claim 1, wherein the OLED device is a display device or an area illumination device or a backlight.

15. The OLED device of claim 1, further comprising a substrate, and wherein the reflective layer is between the substrate and the first or second transparent electrode.

16. The OLED device of claim 1, further comprising a transparent substrate, and wherein the first or second transparent electrode is between the substrate and the reflective layer.

17. The OLED device of claim 1, wherein the reflective layer comprises materials having a dielectric constant with a negative real part.

18. The OLED device of claim 1, wherein the reflective layer comprises materials that have free electrons in a conduction band.

* * * * *

UNITED STATES PATENT AND TRADEMARK OFFICE
CERTIFICATE OF CORRECTION

PATENT NO. : 7,548,021 B2  Page 1 of 1
APPLICATION NO. : 11/232559
DATED : June 16, 2009
INVENTOR(S) : Ronald S. Cok et al.

It is certified that error appears in the above-identified patent and that said Letters Patent is hereby corrected as shown below:

| | |
|---|---|
| Column 13, line 44 | delete "opposite to the and one" and replace with -- opposite to the one --. |
| Column 13, line 50 | delete "the first and" and replace with -- the first or --. |
| Column 14, line 10 | delete "electrodes" and replace with -- electrode --. |
| Column 14, line 13 | after "at least" insert -- one of the --. |
| Column 14, line 24 | replace "Plasmon-" with -- plasmon- --. |
| Column 14, line 27 | delete "first and" and replace with -- first or --. |
| Column 14, line 32 | "Substrate" and replace with -- substrate --. |

Signed and Sealed this

Twenty-eighth Day of July, 2009

JOHN DOLL
*Acting Director of the United States Patent and Trademark Office*